(12) United States Patent
Hineman et al.

(10) Patent No.: US 7,131,391 B2
(45) Date of Patent: Nov. 7, 2006

(54) PLASMA REACTION CHAMBER LINER COMPRISING RUTHENIUM

(75) Inventors: Max F. Hineman, Boise, ID (US); Li Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/247,971

(22) Filed: Sep. 20, 2002

(65) Prior Publication Data

US 2003/0019842 A1 Jan. 30, 2003

Related U.S. Application Data

(62) Division of application No. 09/652,530, filed on Aug. 31, 2000, now Pat. No. 6,547,979.

(51) Int. Cl.
H01L 21/00 (2006.01)
C23C 16/00 (2006.01)

(52) U.S. Cl. ................................. 118/723 R
(58) Field of Classification Search ............ 118/723 R, 118/723 E, 723 MW, 723 I, 715; 156/345.43, 156/345.41, 345.44, 345.47, 345.48; 216/67; 438/710, 758; 427/569
See application file for complete search history.

(56) References Cited

U.S. PATENT DOCUMENTS

| | | | | |
|---|---|---|---|---|
| 3,635,089 A | * | 1/1972 | Harding et al. ................ 73/706 |
| 4,243,506 A | | 1/1981 | Ikeda et al. | |
| 4,526,644 A | | 7/1985 | Fujiyama et al. ........... 156/345 |
| 4,704,301 A | | 11/1987 | Bauer et al. | |
| 5,032,202 A | * | 7/1991 | Tsai et al. ............... 156/345.42 |
| 5,593,541 A | | 1/1997 | Wong et al. | |
| 5,935,340 A | | 8/1999 | Xia et al. | |
| 6,015,761 A | | 1/2000 | Merry et al. | |
| 6,056,823 A | * | 5/2000 | Sajoto et al. ................ 118/715 |
| 6,117,786 A | | 9/2000 | Khajehnouri et al. | |
| 6,150,628 A | | 11/2000 | Smith et al. | |
| 6,217,703 B1 | * | 4/2001 | Kitagawa ................ 156/345.33 |
| 6,221,319 B1 | | 4/2001 | Johnson et al. | |
| 6,251,216 B1 | | 6/2001 | Okamura et al. | |
| 6,258,741 B1 | * | 7/2001 | Kohsaka et al. .............. 501/87 |
| 6,265,317 B1 | | 7/2001 | Hwang et al. | |
| 6,284,146 B1 | | 9/2001 | Kim et al. | |
| 6,367,412 B1 | | 4/2002 | Ramaswamy et al. | |
| 6,368,517 B1 | | 4/2002 | Hwang et al. | |
| 6,368,518 B1 | | 4/2002 | Vaartstra | |
| 6,387,268 B1 | | 5/2002 | Bjorkman et al. | |
| 6,426,302 B1 | * | 7/2002 | Kitagawa ..................... 438/710 |
| 6,451,665 B1 | * | 9/2002 | Yunogami et al. .......... 438/397 |

FOREIGN PATENT DOCUMENTS

JP 7-106301 7/1995

OTHER PUBLICATIONS

S. Wolf, et al., *Silicon Processing for the VLSI Era*, 1986, Lattice Press, vol. 1, pp. 543–544.

* cited by examiner

*Primary Examiner*—Paviz Hassanzadeh
*Assistant Examiner*—Michelle Crowell
(74) *Attorney, Agent, or Firm*—Wells St. John P.S.

(57) ABSTRACT

The invention encompasses a method of enhancing selectivity of etching silicon dioxide relative to one or more organic substances. A material comprising one or more elements selected from Group VIII of the periodic table is provided within a reaction chamber; and a substrate is provided within the reaction chamber. The substrate has both a silicon-oxide-containing composition and at least one organic substance thereover. The silicon-oxide-containing composition is plasma etched within the reaction chamber. The plasma etching of the silicon-oxide-containing composition has increased selectivity for the silicon oxide of the composition relative to the at least one organic substance than would plasma etching conducted without the material in the chamber. The invention also encompasses a plasma reaction chamber assembly. The assembly comprises at least one interior wall, and at least one liner along the at least one interior wall. The liner comprises one or more of Ru, Fe, Co, Ni, Rh, Pd, Os, W, Ir, Pt and Ti.

9 Claims, 3 Drawing Sheets

(100) FORM MATERIAL COMPRISING ONE OR MORE ELEMENTS FROM GROUP VIII OF THE PERIODIC TABLE WITHIN A REACTION CHAMBER
↓
(110) ETCH SiO$_2$ WITHIN THE REACTION CHAMBER
(200) PROVIDE A LINER COMPRISING W, Pt, Ti, AND/OR ONE OR MORE ELEMENTS FROM GROUP VIII OF THE PERIODIC TABLE WITHIN A REACTION CHAMBER
↓
(210) ETCH SiO$_2$ WITHIN THE REACTION CHAMBER

PLASMA REACTION CHAMBER LINER COMPRISING RUTHENIUM

RELATED PATENT DATA

This patent resulted from a divisional application of U.S. patent application Ser. No. 09/652,530, which was filed on Aug. 31, 2000 now U.S. Pat. No. 6,547,979.

TECHNICAL FIELD

The invention pertains to methods of enhancing selectivity of silicon dioxide relative to one or more organic materials, and further pertains to reaction chamber configurations.

BACKGROUND OF THE INVENTION

Semiconductor processing frequently involves etching of silicon-oxide-containing materials, such as, for example, silicon dioxide, borophosphosilicate glass (BPSG), etc. Semiconductor processing also frequently involves patterning etched materials with organic photoresist masking materials. Organic photoresist materials can be either positive or negative photoresists, and can include, for example, novolac and cyclized synthetic rubber resin. A difficulty which can occur in etching silicon-oxide-containing materials results from limited selectivity of present etch methods for silicon-oxide-containing materials relative to organic masking materials. Such difficulty is described with reference to FIGS. 1–3.

Referring first to FIG. 1, a semiconductor wafer fragment 10 is illustrated. Wafer fragment 10 comprises a substrate 12 having a silicon-oxide-containing layer 14 thereover. Substrate 12 can comprise, for example, monocrystalline silicon lightly-doped with a p-type background dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Layer 14 can comprise, for example, silicon dioxide; can consist essentially of silicon dioxide, or can consist of silicon dioxide. Also layer 14 can comprise a doped silicon oxide, such as, for example, BPSG.

A patterned masking layer 16 is shown formed over silicon-oxide-containing layer 14. Masking layer 16 can comprise, for example, an organic photoresist material, and can be patterned by photolithographic processing.

Referring to FIG. 2, wafer fragment 10 is subjected to etching conditions which etch into silicon-oxide-containing material 14 to form an opening 18 extending therein. A suitable etch for silicon-oxide-containing material 14 is a plasma etch utilizing one or more of $CF_4$, $C_2F_6$, $H_2$, $C_3F_8$, and $CHF_3$. FIG. 2 shows a thickness of masking layer 16 reduced during the etching of oxide layer 14. Such reduction in thickness occurs due to non-selectivity of the etch conditions for oxide material 14 relative to masking material 16. Generally, the etching conditions will have some selectivity for oxide layer 14, in that the material of oxide layer 14 will etch faster than will the material of organic masking layer 16. However, the selectivity is not absolute, and accordingly some of the organic material of layer 16 etches during the etching of the silicon oxide of layer 14.

Referring to FIG. 3, wafer fragment 10 is shown after continued etching of layer 14. Such continued etching has removed layer 16 (FIG. 2) from over layer 14. Such removal of layer 16 can be problematic in further processing steps.

It would be desirable to develop alternative methods for etching silicon-oxide-containing materials with enhanced selectivity for the silicon-oxide-containing materials relative to organic materials.

SUMMARY OF THE INVENTION

In one aspect, the invention encompasses a method of enhancing selectivity of etching silicon dioxide relative to one or more organic substances. A material comprising one or more elements selected from Group XVIII of the periodic table is provided within a reaction chamber; and a substrate is provided within the reaction chamber. The substrate has both a silicon-oxide-containing composition and at least one organic substance thereover. The silicon-oxide-containing composition is plasma etched within the reaction chamber. The plasma etching of the silicon-oxide-containing composition has increased selectivity for the silicon oxide of the composition relative to the at least one organic substance than would plasma etching conducted without the material in the chamber.

In another aspect, the invention encompasses a plasma reaction chamber assembly. The assembly comprises at least one interior wall, and at least one liner along the at least one interior wall. The liner comprises one or more of Ru, Fe, Co, Ni, Rh, Pd, Os, W, Ir, Pt and Ti.

BRIEF DESCRIPTION OF THE DRAWINGS

Preferred embodiments of the invention are described below with reference to the following accompanying drawings.

FIG. 4 is a flow chart diagram of a first embodiment method of the present invention.

FIG. 5 is a flow chart diagram of a second embodiment method of the present invention.

DETAILED DESCRIPTION OF THE PREFERRED EMBODIMENTS

Figure 1:
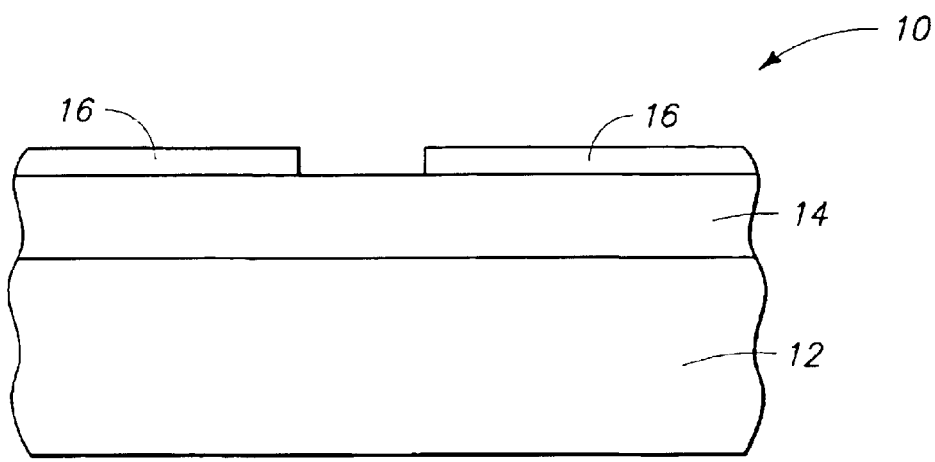
FIG. 1 is a diagrammatic, fragmentary, cross-sectional view of a semiconductor wafer at a preliminary processing step of a prior art method.
Figure 2:
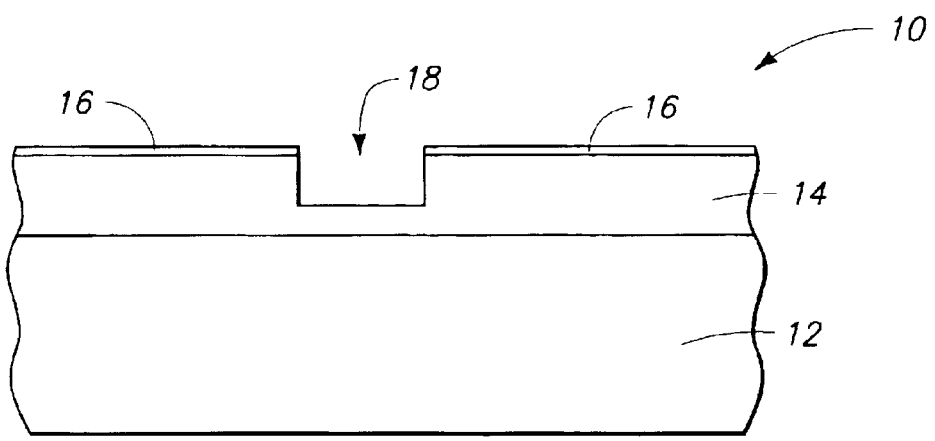
FIG. 2 is a view of the FIG. 1 wafer fragment shown at a prior art processing step subsequent to that of FIG. 1.
Figure 3:
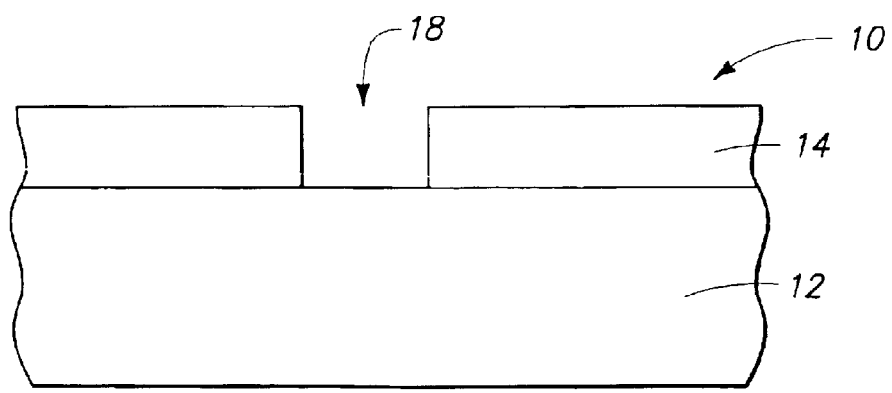
FIG. 3 is a view of the FIG. 1 wafer fragment shown at a prior art processing step subsequent to that of FIG. 2.

This disclosure of the invention is submitted in furtherance of the constitutional purposes of the U.S. Patent Laws "to promote the progress of science and useful arts" (Article 1, Section 8).

The invention encompasses methods for increasing selectivity of silicon oxide etching relative to organic materials. One embodiment of the present invention is described with reference to FIG. 4. At an initial step 100 a material comprising one or more elements from Group VIII of the periodic table (i.e., one or more of Fe, Co, Ni, Ru, Rh, Pd, Os, Ir, and Pt) is provided within a reaction chamber. The material can consist essentially of one or more elements selected from Group VIII of the periodic table, or can consist of one or more elements selected from Group VIII of the period table.

One method of forming the material within a reaction chamber is to place a mass comprising one or more elements selected from Group VIII of the periodic table within the reaction chamber. Such mass can be in the form of a liner which is fabricated outside of the reactor and subsequently placed within the reaction chamber. Alternatively, the mass can be in the form of a material which is subjected to etching within the chamber. Such etching can cause compositions comprising one or more Group VIII elements to be expelled from the mass and deposited as a second mass along an interior of the reaction chamber.

After the material comprising the one or more Group VIII elements is provided within the reaction chamber, a silicon-oxide-containing composition is etched within the chamber. Suitable silicon-oxide-containing compositions include, for example, silicon dioxide and BPSG. In particular embodiments, the etched composition can consist essentially of silicon dioxide, or can consist of silicon dioxide.

Although the invention is described above with reference to forming a material comprising one or more Group VIII elements within a reaction chamber prior to etching a silicon-oxide-containing composition within the reaction chamber, it is to be understood that the Group VIII element can also be provided during the etching of the silicon-oxide-containing component. For instance, if a semiconductor wafer comprises both silicon dioxide and a Group XVIII material thereon during etching of the silicon-oxide-containing material, the Group VIII element will be provided within the chamber at the same time that the silicon-oxide-containing composition is provided within the chamber.

It has been experimentally determined that the inclusion of one or more Group VIII elements within a reaction chamber can increase selectivity of a plasma etch for a silicon-oxide-composition relative to an organic material. For instance, if ruthenium is provided within a reaction chamber during a plasma etch of silicon dioxide, a selectivity of an etch for silicon dioxide relative to a photoresist can be enhanced. For purposes of interpreting this disclosure and the claims that follow, the term "selective" refers to an etch which is faster with respect to one material than to another, and enhancement of selectivity indicates that the difference in the relative etch rates is increased. A particular experiment is described below as Example 1.

There are several mechanisms by which enhancement of selectivity for a silicon-oxide-containing material relative to an organic material can be enhanced. One mechanism is that reactive species such as mono-atomic oxygen and mono-atomic fluorine are removed. For instance, the Group XVIII elements provided within the reaction chamber can catalyze recombination of mono-atomic oxygen (which can be formed in a reaction chamber during an etch of a silicon-oxide-comprising material) with other materials to reduce a concentration of mono-atomic oxygen within a reaction chamber. As mono-atomic oxygen is highly reactive, and accordingly relatively non-selective for silicon-oxide-comprising materials to organic materials, increased selectivity can be achieved by reducing the mono-atomic oxygen concentration. If two mono-atomic oxygen species are recombined together, the result is diatomic oxygen ($O_2$). Alternatively, mono-atomic oxygen can be recombined with components other than monoatomic oxygen within a reaction chamber.

Another species which is highly reactive in reaction chambers is mono-atomic fluorine. The Group VIII elements can catalyze recombination of mono-atomic fluorine with other species to reduce a concentration of mono-atomic fluorines within a reaction chamber. If two mono-atomic fluorines are combined together, the result is diatomic fluorine ($F_2$). Alternatively, mono-atomic fluorine can be combined with carbon-containing materials to form $HCF_3$, $CF_4$, etc.

Another mechanism by which enhancement of selectivity for a silicon-oxide-containing material relative to an organic material can be enhanced with Group VIII elements is that the elements may modify organic materials to decrease an etch rate of the organic materials.

FIG. 5 shows a flow chart diagram of a particular embodiment of the present invention wherein a liner is provided within a reaction chamber. Specifically, the first step of FIG. 5 is to provide a liner which comprises tungsten, platinum, titanium and/or one or more elements from Group VIII of the periodic table within a reaction chamber. Such liner will be formed outside of the reaction chamber, and subsequently inserted within the reaction chamber. The metallic components of the liner can increase selectivity of a plasma etch for silicon-oxide-containing components relative to organic materials. For instance, it has been experimentally determined that tungsten can increase such selectivity. Particular experimental conditions are described with reference to Example 2 below.

Step 210 of FIG. 5 indicates that a silicon-oxide-containing material (specifically silicon dioxide) is etched within the reaction chamber after the liner is inserted.

Figure 6:
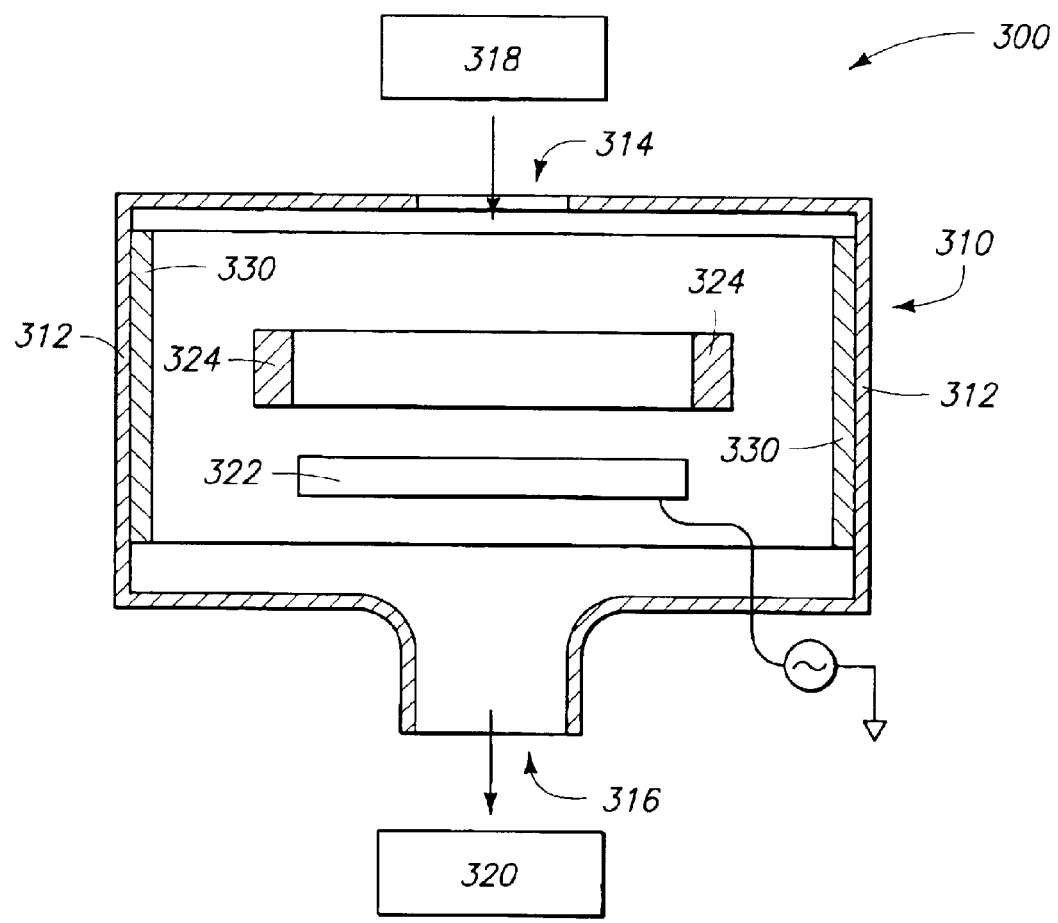
FIG. 6 is a diagrammatic, cross-sectional view of a reaction chamber apparatus which can be utilized in methodology of the present invention.

FIG. 6 illustrates an exemplary apparatus 300 which can be utilized in the process of FIG. 5. Specifically, apparatus 300 comprises a reaction chamber 310 having sidewalls 312. Reaction chamber 310 also has an orifice 314 extending into the chamber and an orifice 316 extending out of the chamber. A source of plasma gases 318 is provided outside of chamber 310, and gases are flowed from source 318 into chamber 310. Source 318 can comprise, for example, one or more of $CF_4$, $CHF_3$, $H_2$ and $C_2F_6$. Although only a single source 318 is shown, it is to be understood that multiple sources can be provided, and multiple gases flowed into chamber 310. Outlet 316 is coupled with a pump 320 which removes gases from chamber 310 to maintain a flow of gases through is chamber 310, and also to maintain a desired pressure within chamber 310. A substrate 322 is shown provided within chamber 310. Substrate 322 can be retained within substrate 310 on a substrate holder (not shown). Substrate 322 is shown coupled to a bias.

Also shown within chamber 310 is a focusing ring 324. Focusing ring 324 is utilized to focus reactive components from a plasma (not shown) which would be formed within chamber 310 for etching a silicon-oxide-material (not shown) associated with substrate 322. The chamber 310 described thus far can comprise conventional materials, and a conventional construction. Accordingly, sidewalls 312 can comprise, for example, quartz or ceramic materials (such as, for example, alumina).

Apparatus 300 differs from conventional apparatuses, however, in that one or more liners 330 are provided within reaction chamber 310. Reaction chamber 310 can comprise a circular construction, and accordingly, liner 330 can comprise a cylindrical shape configured to slip within chamber 310 and along sidewalls 312. Alternatively, liner 330 could comprise other shapes, and can be provided within other interior regions of chamber 310 than along sidewalls 312. Liner 330 is preferably formed of one or more of Ru, Fe, Co, Ni, Rh, Pd, Os, W, Ir, Pt, and Ti. Accordingly, liner 330 can enhance selectivity of an etch for a silicon-oxide-containing composition relative to organic materials. Exemplary compositions of liner 330 are elemental forms of one or more of the Group VIII elements, tungsten, platinum and titanium; or alloy forms of one or more of the Group VIII elements and/or one or more of tungsten, platinum and titanium.

Liner 330 can also consist of, or consist essentially of, one or more of the Group VIII elements and/or one or more of tungsten, platinum and titanium.

It is noted that a liner is different than merely being a coating on a sidewall of a reactor. Specifically, a "liner" is defined hereby to comprise a material which is formed outside of a reaction chamber, and subsequently inserted within a reaction chamber, and accordingly does not encompass deposits formed during etching of materials within the reaction chamber.

EXAMPLE 1

A first wafer comprising ruthenium in the form of ruthenium metal or ruthenium oxide is provided within a reaction chamber, and etched to form a ruthenium deposit along an interior of the chamber. Subsequently, a wafer comprising silicon dioxide and an organic photoresist material (specifically, the photoresist can be, for example, deep UV or I-line photoresist) is provided within the chamber. The silicon dioxide is etched utilizing a plasma etch comprising $CF_4$, $CHF_3$ and argon. It is found that the selectivity of the etch for silicon dioxide is enhanced relative to a selectivity which would exist in the absence of the ruthenium deposit. Specifically, it is found that the selectivity for silicon dioxide relative to the photoresist is 3.5:1 in the presence of the ruthenium deposit, whereas a selectivity of silicon dioxide relative to photoresist is measured to be 3:1 in the absence of the ruthenium deposit.

EXAMPLE 2

A liner comprising tungsten in the form of tungsten metal is provided within a reaction chamber. Subsequently, a wafer comprising silicon dioxide and an organic photoresist material is provided within the chamber. The silicon dioxide is etched utilizing a plasma etch comprising $CF_4$ and $CHF_3$.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A plasma reaction chamber having a liner consisting essentially of Ru, wherein the plasma reaction chamber consisting essentially of at least one interior wall and the liner is proximate the interior wall.

2. The reaction chamber of claim 1 wherein the liner is physically against the interior wall.

3. The reaction chamber of claim 1 wherein the interior wall comprises alumina.

4. The reaction chamber of claim 1 further comprising a focusing ring within the chamber.

5. The reaction chamber of claim 1 wherein the reaction chamber is a circular construction having a continuous interior wall.

6. The reaction chamber of claim 5 wherein the liner comprises a cylindrical shape configured to slip within the interior wall of the reaction chamber.

7. A plasma reaction chamber comprising:
   at least one sidewall, the sidewall having an inner surface; and
   at least one liner proximate the inner surface, wherein the liner consists essentially of Ru.

8. The plasma reaction chamber of claim 7 wherein the sidewall comprises alumina.

9. The plasma reaction chamber of claim 7 wherein the liner is physically against the inner surface.

* * * * *

UNITED STATES PATENT AND TRADEMARK OFFICE
CERTIFICATE OF CORRECTION

PATENT NO.         : 7,131,391 B2                                               Page 1 of 1
APPLICATION NO. : 10/247971
DATED              : November 7, 2006
INVENTOR(S)        : Ramaswamy et al.

It is certified that error appears in the above-identified patent and that said Letters Patent is hereby corrected as shown below:

Title Page, U.S. PATENT DOCUMENTS, please delete "6,387,268" after "Vaartstra" and insert --6,387,288--.

Col. 2, line 14, please delete "XVIII" after "Group" and insert --VIII--.

Col. 2, line 67, please delete "period" before "table" and insert --periodic--.

Col. 3, line 26, please delete "XVIII" after "Group" and insert --VIII--.

Col. 3, line 50, please delete "XVIII" after "Group" and insert --VIII--.

Col. 4, line 43, please delete "is" after "through".

Signed and Sealed this

Fourth Day of September, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,131,391 B2 | Page 1 of 1 |
| APPLICATION NO. | : 10/247971 | |
| DATED | : November 7, 2006 | |
| INVENTOR(S) | : Max F. Hineman and Li Li | |

It is certified that error appears in the above-identified patent and that said Letters Patent is hereby corrected as shown below:

Col. 6, claim 1, please make the following correction:

A plasma reaction chamber having a liner consisting essentially of Ru, wherein the plasma reaction chamber ~~consisting essentially of~~ comprises at least one interior wall and the liner is proximate the interior wall.

Signed and Sealed this

Twenty-third Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,131,391 B2
APPLICATION NO. : 10/247971
DATED : November 7, 2006
INVENTOR(S) : Max F. Hineman and Li Li It is certified that error appears in the above-identified patent and that said Letters Patent is hereby corrected as shown below:

Col. 6, claim 1, lines 14-17 should read:

A plasma reaction chamber having a liner consisting essentially of Ru, wherein the plasma reaction chamber ~~consisting essentially of~~ comprises at least one interior wall and the liner is proximate the interior wall.

This certificate supersedes the Certificate of Correction issued September 23, 2008.

Signed and Sealed this

Fourteenth Day of October, 2008

JON W. DUDAS
*Director of the United States Patent and Trademark Office*